(12) United States Patent
Lowther et al.

(10) Patent No.: US 6,278,186 B1
(45) Date of Patent: *Aug. 21, 2001

(54) PARASITIC CURRENT BARRIERS

(75) Inventors: Rex E. Lowther; William R. Young, both of Palm Bay, FL (US)

(73) Assignee: Intersil Corporation, Palm Bay, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,932

(22) Filed: Aug. 26, 1998

(51) Int. Cl.[7] ............... H01L 23/528; H01L 23/52; H01L 23/532
(52) U.S. Cl. ............... 257/750; 257/754; 257/756; 257/773; 257/776
(58) Field of Search ............... 257/531, 656, 257/659, 750, 751, 754–758, 773, 776

(56) References Cited

U.S. PATENT DOCUMENTS

| | | | |
|---|---|---|---|
| 4,543,595 | * 9/1985 | Vora | 257/754 |
| 4,754,546 | * 7/1988 | Lee et al. | 29/877 |
| 4,894,114 | 1/1990 | Nathanson . | |
| 4,954,873 | * 9/1990 | Lee et al. | 257/702 |
| 5,194,402 | 3/1993 | Ehrfeld et al. . | |
| 5,420,558 | 5/1995 | Ito et al. | 336/200 |
| 5,431,987 | 7/1995 | Ikeda | 428/209 |
| 5,446,311 | 8/1995 | Ewen et al. | 257/531 |
| 5,519,582 | 5/1996 | Matsuzaki | 361/783 |
| 5,675,298 | 10/1997 | Bhagwan et al. | 333/1 |
| 5,717,243 | 2/1998 | Lowther | 257/531 |
| 5,773,891 | * 6/1998 | Delgado et al. | 257/754 |
| 5,909,059 | * 6/1999 | Hada et al. | 257/750 |

FOREIGN PATENT DOCUMENTS 0 837 503 A2    4/1998  (EP) .
WO 97/45873   12/1997  (WO) .

OTHER PUBLICATIONS

Electronic Engineering Times, Sep. 15, 1997 "Contact change boots inductor quality", Chappell Brown, p. 41.

IEEE Journal of Solid–State Circuits, "On–Chip Spiral Inductors with Patterned Ground Shields for Si–Based RF IC's", vol. 33, No. 5, May 1998, C. Patrick Yue, Student Member, IEEE, and S. Simon Wong, Senior Member, IEEE.

International Search Report EP 99402081 Apr. 2000.

* cited by examiner

Primary Examiner—Eddie C. Lee
Assistant Examiner—Allan R. Wilson
(74) Attorney, Agent, or Firm—Jaeckle Fleischmann & Mugel, LLP.

(57) ABSTRACT

In one embodiment a substrate 14 is patterned to have high and low conductive areas 110, 112, respectively. Metal lines 104, 108 in dielectric layer 16 pass transversely over the areas 110, 112. The areas 112 interrupt parasitic inductive current induced in the substrate 14.

48 Claims, 5 Drawing Sheets

PARASITIC CURRENT BARRIERS

BACKGROUND

This is an improvement of the invention shown in U.S. Pat. No. 5,717,243, the entire disclosure of which is herein incorporated by reference. Integrated circuits have one or more levels of metal formed on dielectric material that covers a semiconductor substrate. The levels of metal are separated by dielectric material. The substrate that holds the integrated circuits is made of semiconductor material. The metal levels are patterned into lines that can be characterized as either signal lines (which carry a signal), return lines (which are signal lines carrying current in the opposite direction to another signal line), or lines attached to ground (ground lines). Parasitic currents can flow in the substrate due either to capacitive coupling or to inductive coupling to these metal lines.

Consider FIGS. 1(a) and 1(b) where one or more first metal line(s) 104 carries a signal and one or more ground lines 108 that run parallel to signal line(s) 104. The lines 104, 108 are supported on dielectric layer 16 that covers the semiconductor substrate 14. The substrate 14 is doped at around 10 to 20 ohm-cm. With this resistivity, the primary power loss is due to resistive current flow through the substrate that is capacitively generated from the signal line. The resistive current flow in the substrate caused by the signal line can be redirected by the presence of a nearby ground line which then tends to become the primary destination of this current. Without doing anything special, this will reduce the resistance somewhat but will not greatly reduce the resistive losses. This particular loss factor can be nearly eliminated by pursuing one of two strategies: The first strategy is to make the path so highly resistive that current cannot flow at all. The second strategy, pursued here, is to make the path so conductive that the resistive loss is very small even though the current is free to flow. The problem introduced by making the path conductive is that another parasitic current is formed. In many instances, this other parasitic current is worse than the eliminated parasitic current. This other parasitic current is an inductively induced image current L of the signal line in the conductive part of the substrate. This image current L is opposite to the current in the signal line and parallel in direction. The path of the capacitively generated current in the substrate from the signal line to the ground line is perpendicular to the signal line as shown by arrow C; the inductively induced current in the substrate is parallel to the signal line as shown by arrow L.

The substrate resistive loss due to inductive coupling to a heavily doped layer can be calculated. In this calculation, the substrate is doped with a buried layer with a resistance of 8.1 Ohms/square. The signal line 104 is above the dopant 20(a), as shown in FIG. 2(a), and is 2.5 um thick, 20 um wide, and 1,000 um long. The power loss in the substrate, $P_s$, is $$P_s = V_s^2 / R_s \qquad \text{Equation (1)}$$

where $R_s$ is the resistance in the conductive path through the substrate and $V_s$ is the voltage difference in the substrate below the metal line caused by mutual inductive coupling from the signal line above.

$V_s$ is related to the current in the metal line ($I_m$) by the formula $$V_s = M \omega I_m \qquad \text{Equation (2)}$$

where M is the mutual inductance between the signal line 104 and the conductive path in the substrate 14, and $\omega$ is the frequency in radians/second. Substituting this into the formula for $P_s$ gives $$P_s = (M \omega I_m)^2 / R_s \qquad \text{Equation (3)}$$

The active doped region of the substrate is assumed to be 30 $\mu$ms wide and 1000 $\mu$ms long. From analytic inductance equations, M=8.2 e –10 Henrys. $R_s$, the resistance in the substrate below the signal line, is calculated from the sheet resistance and the geometry as $$R_s = (8.1 \text{ Ohms})(1000 \; \mu\text{m})/(30 \; \mu\text{m}) = 270 \text{ Ohms} \qquad \text{Equation (4)}$$

Choosing a frequency of 5 GHz and substituting these values into Equation (3), we get $$P_s = 2.50 I_m^2 \qquad \text{Equation (5)}$$

where mks units are assumed. For comparison, the resistive loss in the metal is $$P_m = R_m I_m^2 \sim 0.75 I_m^2 \qquad \text{Equation (6)}$$

The above analysis shows that in the prior art structure the resistive loss through the substrate is roughly comparable to but greater than the loss in the signal line 104 (in this case, more that 3 times greater). It would be desirable to reduce such losses.

SUMMARY OF THE INVENTION

A solution to the problem of parasitic current is as follows: let the perpendicular current in the substrate flow easily and prevent the parallel flow. This result is accomplished by directionally patterning the substrate doping to achieve this result. In particular, the substrate is patterned to have sequential strips of alternating relative high and low conductivity disposed beneath the signal and ground lines such that the boundaries between adjacent strips are in the direction transverse to the signal and ground lines. The highly conductive regions allow the capacitively generated current to flow in the transverse direction. The low conductive regions interrupt the parallel flow of inductively induced current. Such a structure allows easy flow of capacitively generated current to ground and thereby improves substrate loss and a shielding effect that reduces coupling to other devices through the substrate—without allowing the parasitic image current to flow in the substrate parallel to the metal lines.

Alternatively, other conductive layers can be patterned to replace the dopant. Instead of being in the semiconductor, the conductive layers are on or above the semiconductor layer. Each conductive layer is more conductive than the semiconductor substrate.

Additionally, multiple patterned conductive layers can be used to provide a more complete shield from the capacitively generated current. One embodiment provides for isolating one current carrying line from capacitively inducing current in one or more other current carrying lines.

DETAILED DESCRIPTION OF THE INVENTION

Figure 1A:
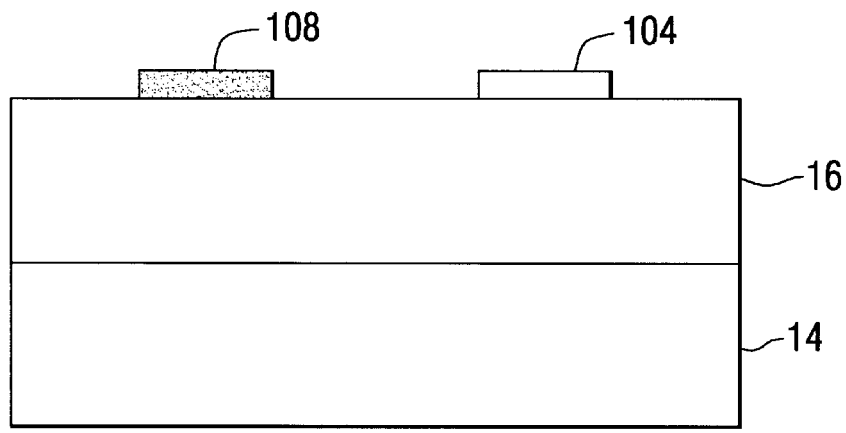
FIG. 1(a) is a cross-sectional view of prior art.
Figure 1B:
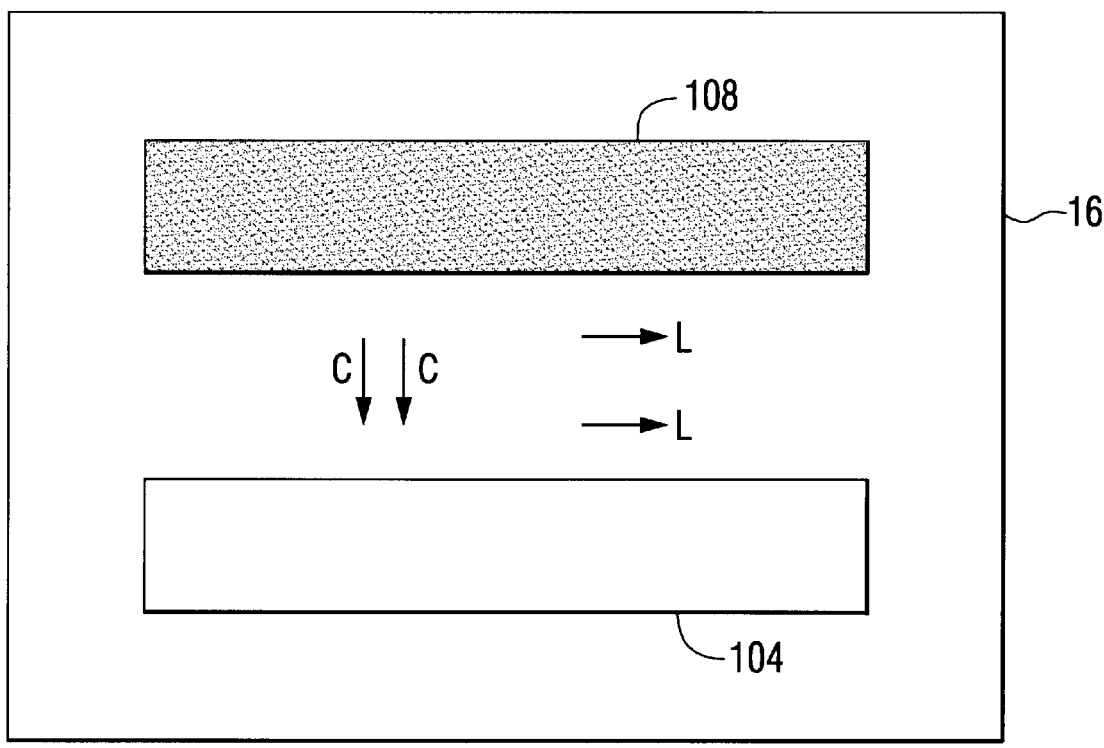
FIG. 1(b) is a top view of FIG. 1(a).
Figure 2A:
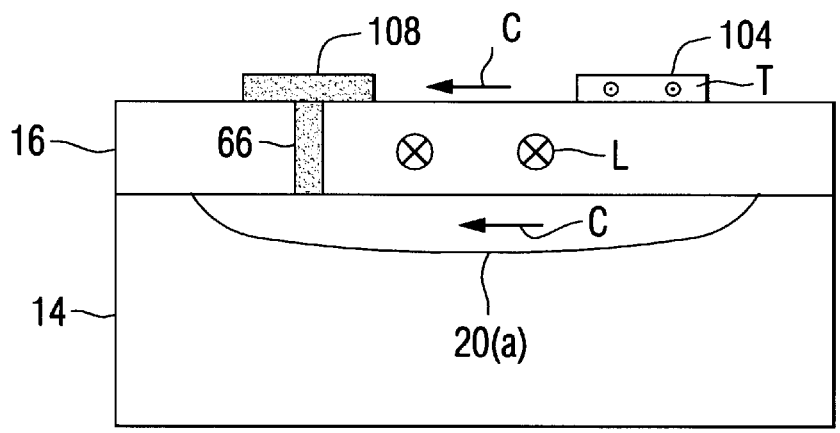
FIG. 2(a) is a cross-sectional view of an alternative embodiment of the present invention.
Figure 2B:
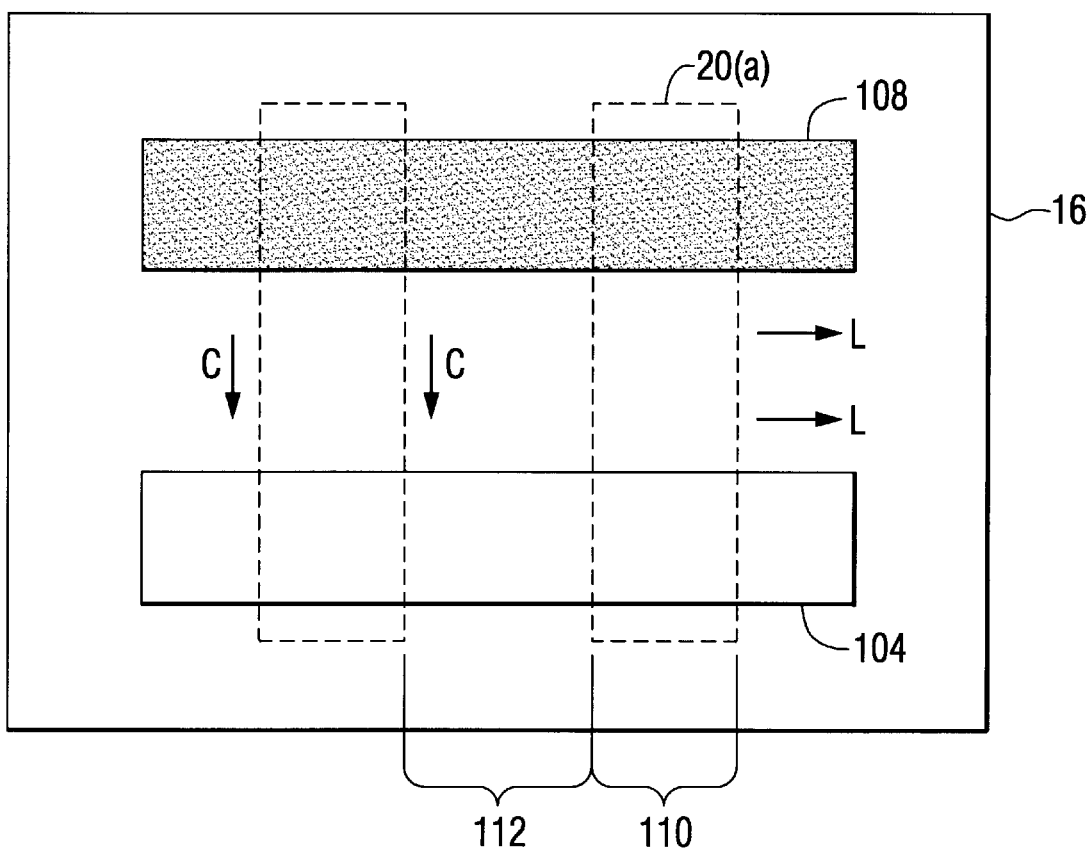
FIG. 2(b) is a top view of FIG. 2(a).

FIGS. 2(a) and 2(b) illustrate one embodiment of the present invention. Both show a first metal line 104 that carries a signal and a ground line 108. The metal lines 104, 108 are patterned over the dielectric layer 16 and the dielectric layer 16 is over the substrate 14. Dopant 20(a) patterns the substrate 14 into a plurality of sequential, alternating highly conductive areas 110 and low conductivity or resistive areas 112. Each area 110 is beneath a portion of the first metal line 104 and a portion of the second metal line 108. Optionally, conducting contacts 66 connect each of the highly conducting areas to one or more of the lines. A gap or low conductivity region 112 separates each area 110 from other areas 110 as shown in FIG. 2(b). Each region 112 keeps the resistance high for current crossing it. Each region 112 can be an undoped portion of the substrate 14 or a trench. The trench would be filled with resistive or dielectric material. Those skilled in the art understand how to mask the substrate 14 to form and fill trenches or form alternating regions of doped and undoped areas.

The path of the capacitively generated current in the substrate 14 from below the first metal line 104 to the second metal line 108 is shown by arrow C. The inductively induced current in the substrate 14 is parallel to the first metal line 104. This is indicated by the arrow L. The current path C is unobstructed whereas the current path L is blocked by the undoped regions 112. The structure illustrated in FIGS. 2(a) and 2(b) allows the perpendicular current to flow easily, yet prevents the parallel flow. Another way to say this is that this structure allows easy flow to the ground line without allowing the image current to flow in the substrate 14.

The improved substrate loss provided by the easy path from below the first metal line 104 to second metal line 108 illustrated in FIGS. 2(a) and 2(b) is not necessarily the most important benefit of doping the substrate 14. The coupling to other devices (not shown) through the substrate 14 is greatly reduced by the shielding effect of this structure. The patterning of dopant 20(a) allows us to do this by preventing the image current that would otherwise become important at these doping levels.

Figure 3A:
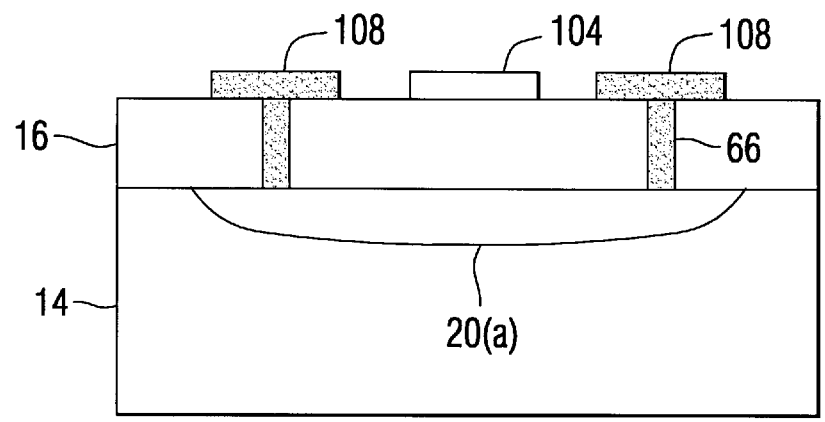
FIG. 3(a) is a cross-sectional view of an alternative embodiment of FIG. 2(a).
Figure 3B:
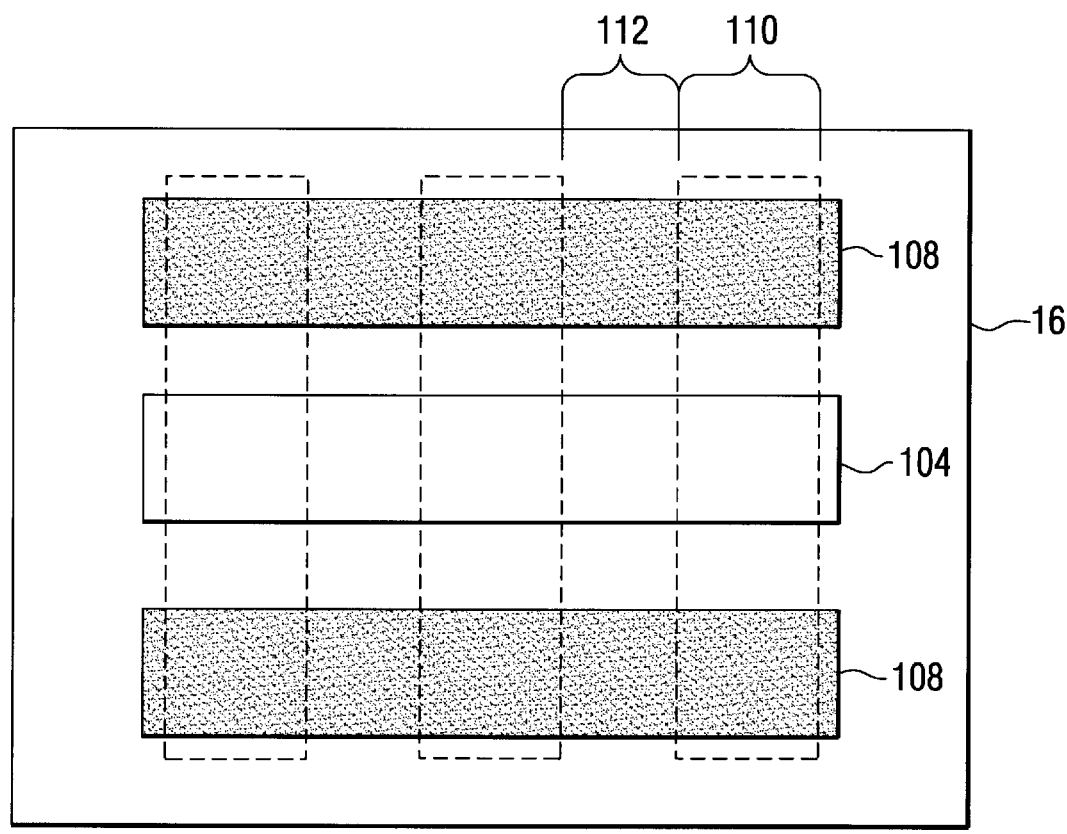
FIG. 3(b) is a top view of FIG. 3(a).

In general, any number of signal and return/ground lines in parallel can use this invention. For example, in FIGS. 3(a) and (b) there are three parallel metal lines: two parallel return (or ground) metal lines 108 and a center signal metal line 104. The lines are on the dielectric layer 16 and the dielectric layer 16 is over the substrate 14. The two return lines 108 parallel and surround the first metal line 104. Dopant 20(a) patterns substrate 14 into a plurality of conductive and nonconductive areas designated 110, 112, respectively, as shown in FIG. 3(b). Boundaries between adjacent areas 110, 112 run transverse to a portion of the signal line 104 and a portion of both return lines 108. The low conductive regions 112 separate each area 110 from other areas 110. A series of highly conductive regions 110, combined with contacts 66, connect the two return lines 108 in a geometry that looks like the signal line 104 is over a railroad track as shown in FIG. 3(b). As described above, trenches filled with resistive or dielectric material may be substituted for the nonconductive regions 112.

Figure 4A:
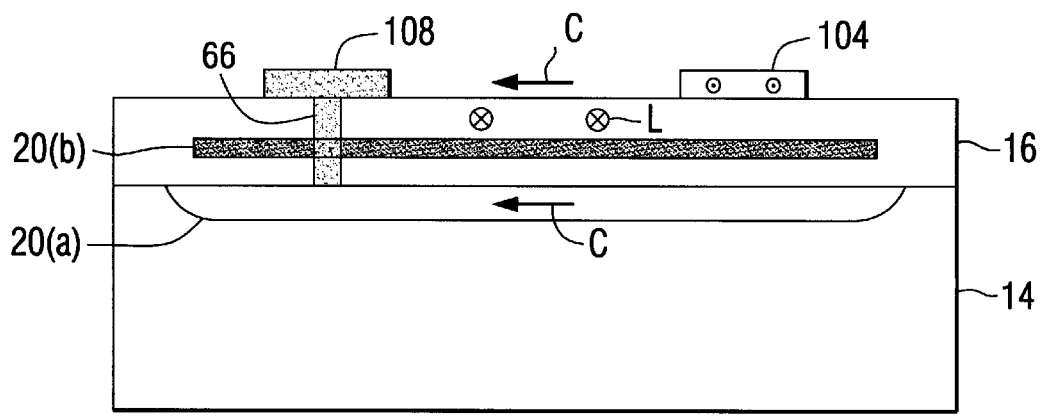
FIG. 4(a) is a cross-sectional view of an alternative embodiment of FIG. 2(a).
Figure 4B:
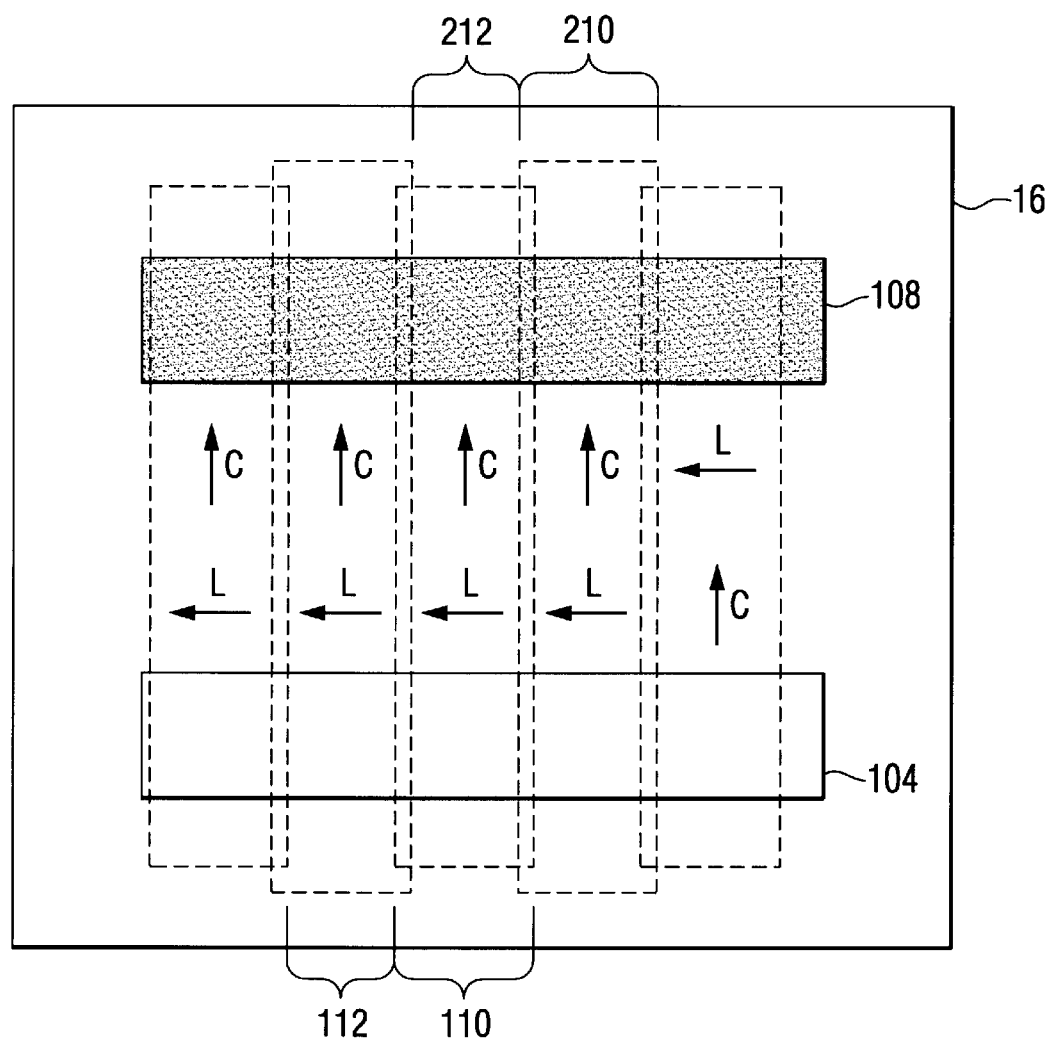
FIG. 4(b) is a top view of FIG. 4(a).

FIGS. 4(a) and 4(b) illustrate a variation of FIGS. 2(a) and 2(b) wherein an additional patterned conductive layer 20(b) is utilized. The conductive portions 210 of the additional layer 20(b) are disposed to cover most of or overlap the low conductivity regions 112 of the original patterned layer. The idea behind this is that capacitively generated charge will be intercepted by either of the two patterned layers 20(a), 20(b) before it can get to the substrate. The main advantage of using multiple patterned layers is that coupling to other devices through the substrate is greatly reduced. The example of multiple layers in FIGS. 4(a) and 4(b) shows one layer in the substrate 14 and another in the insulating layer 16 between the lines and the substrate.

Those skilled in the art will understand that single or multiple layers for intercepting the induced current may also be placed in layers above the lines so that the lines are between the layers and the substrate. Of course, a device may have the intercepting layers on both sides, i.e., above the lines and below the lines. In addition, a single patterned layer is not necessarily limited to the substrate, but may also be on or above the substrate. Examples of layers that could be patterned for this purpose are: doped polysilicon, the doping in the polysilicon, silicide layers, and other metal layers. In other embodiments either the silicon or the polysilicon is doped in alternate sequential regions of n-type and p-type doping. A further embodiment uses a heavily doped layer in the semiconductor that is masked and interrupted with periodic trenches filled with insulating material to form alternate sequential regions of high and low conductivity. The intercepting layer is on one side of the conductors, preferably on the side between the conductors and the substrate. However, there may be multiple intercepting layers, including one or more layers on both sides of the conductors.

The intercepting layers could also be made from anisotropically conductive material, i.e., material that conducts in a first direction but not in a second direction transverse to the first direction. Examples of anisotropically conductive materials include an insulating medium with metal fibers embedded in the medium and aligned in the same direction. Another example is a medium comprising long molecules aligned in one direction that preferentially conduct along their length but not from one molecule to another. A third example is graphite which bonds in sheets and conducts current preferentially within sheets but not between sheets. A fourth example is high-temperature superconductors which also display anisotropic conductivity. In each of the above examples, the anisotropically conductive material should be aligned to preferentially conduct current in the direction transverse to the metal lines rather than parallel to the metal lines.

Figure 5A:
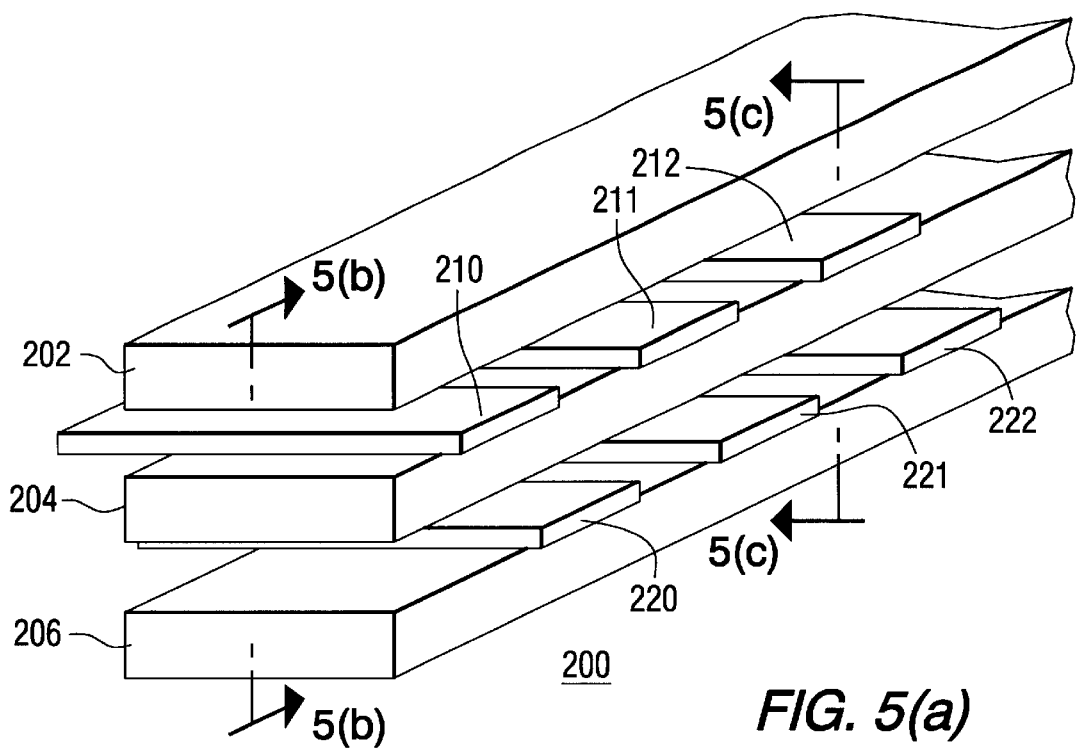
FIG. 5(a) is a partial perspective view of a structure capacitively isolating a current carrying line.
Figure 5B:
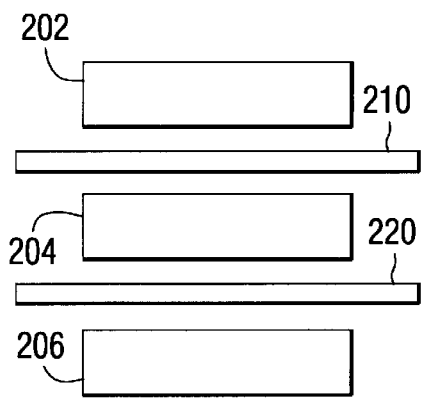
FIGS. 5(b) and 5(c) are end and side views of the structure of FIG. 5(a).
Figure 5C:
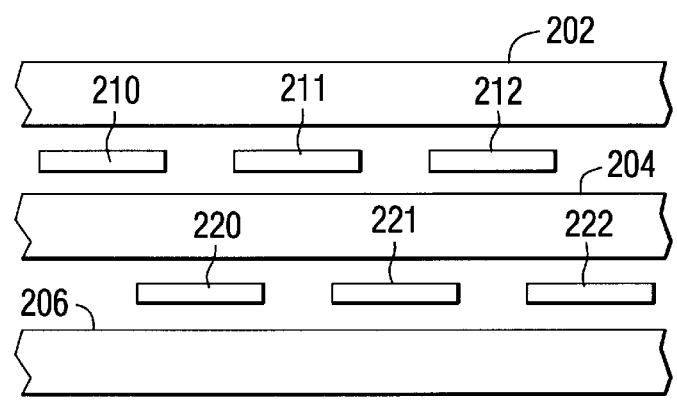

A more general application of the invention is shown in FIGS. 5a, 5b and 5c. There the invention provides a shielded line 204 that has reduced capacitive coupling from lines 202 and 206. Three current carrying lines, 202, 204, and 206 are arranged in parallel alignment with and spaced from each other. The lines are supported in an insulating medium such as silicon dioxide or plastic (not shown). Between lines 202 and 204 there is a set of transverse strips 210, 211, 222 and between pairs 204 and 206 there is a corresponding set of transverse strips 220, 221, 222 that carry current in a direction transverse to the current carried in lines 202, 204, and 206. The sets of transverse strips 210–212 and 220–222 are held in the insulating material (not shown) and are spaced from each of the current carrying lines. The structure 200 isolates line 204 capacitively from lines 202 and 206. The transverse strips 210–212 intercept capacitive current induced by signal lines 202 and 204. Likewise, transverse strips 220–222 intercept capacitive currents induced by currents running in lines 204 and 206. No inductively induced currents will be introduced in the shield lines 210–212 nor lines 220–222 by lines 202, 204 or 206 because the shield lines carry current only in a direction transverse to the current carried in signal lines 202, 204, and 206. Additional staggered layers can be added to provide a more complete capacitive shield as shown as 210 and 212 in FIG. 4(b).

Those skilled in the art will appreciate that the embodiments of the invention while disclosed in and on a semiconductor substrate may also be fashioned on other substrates, including silicon-on-insulator, silicon-on-sapphire, dielectrically isolated substrates, and printed circuit boards. The insulating material may be any suitable insulator compatible with the substrate, including and not limited to silicon dioxide and silicon nitride for semiconductor, silicon, silicon-on-sapphire, and silicon-on-insulator substrates. The substrate may itself comprise the insulating material, such as mica or printed circuit board material. Other common insulators, such as plastic, may be used in connection with printed circuit boards. The invention can be used even if there is no substrate and the signal lines are supported by other means, e.g. in a channel structure where the walls of the channel are insulating material for supporting the edges of the current carrying lines and the ends of the strips. The insulating material may be air or other suitable insulators.

From the foregoing description, it will be apparent that there has been provided improved system, method and apparatus for an integrated circuit with a structure for improved metal line parasitics. Variations and modifications in the herein described systems, in accordance with the invention, will undoubtedly suggest themselves to those skilled in the art. Accordingly, the foregoing description should be taken as illustrative and not in a limiting sense.

What is claimed is:

1. In a semiconductor device, a structure for conducting current and reducing parasitic effects of currents generated in the semiconductor substrate, said structure comprising:
   a substrate of semiconductor material;
   two or more elongated conductors over the substrate, each conductor parallel to the other(s) for at least a portion of their respective lengths and capable of capacitively and inductively inducing current in the substrate; and
   a single current barrier layer proximate the elongated conductors comprising a plurality of adjacent sequentially and coplanar alternating regions of high conductivity and high resistivity defined within said current barrier layer, boundaries between adjacent said regions oriented transversely with respect to the conductors so that said current barrier layer intercepts and conducts current capacitively generated in the substrate by the conductors and blocks current inductively induced in the substrate by the conductors.

2. The structure of claim 1, wherein said current barrier layer comprises semiconductor material and said regions of alternating high conductivity and high resistivity comprise alternate regions of high and low doping in said semiconductor material.

3. The structure of claim 1, wherein said current barrier layer comprises a single layer of polysilicon and the regions of alternating high conductivity and resistivity comprise alternate regions of high and low doping in said single layer of polysilicon.

4. The structure of claim 1 wherein the regions of alternating conductivity comprise spaced apart strips of polysilicon and gaps between said strips.

5. The structure of claim 1 wherein the regions of alternating conductivity comprise spaced apart strips of silicide and gaps between said strips.

6. The structure of claim 1 wherein the regions of alternating conductivity comprise spaced apart strips of metal and gaps between said strips.

7. The structure of claim 1 wherein the regions of alternating conductivity comprise alternate regions of highly doped silicon and isolation trenches.

8. The structure of claim 1 wherein the regions of alternating conductivity comprise alternate regions of highly doped silicon of alternating n-type and p-type doping.

9. The structure of claim 1 comprising at least one current barrier layer disposed either above or below the conductors.

10. The structure of claim 9 comprising two current barrier layers each disposed on opposite sides of the conductors wherein one current barrier layer is disposed on one side of the conductors between the conductors and the substrate and the other current barrier layer is disposed on the other side of the conductors and over the conductors.

11. The structure of claim 1, wherein the current barrier layer comprises a layer of insulating material with a patterned metal comprising openings in the metal layer transverse to the elongated conductors for establishing areas of high resistivity in said openings.

12. The structure of claim 1 wherein the current barrier layer comprises an anisotropically conductive material that conducts current in the direction transverse to the conductors and is highly resistive to current parallel to the conductors.

13. The structure of claim 12 wherein the anisotropically conductive material is selected from the group consisting of: (1) conductive fibers aligned perpendicular to the direction of the conductors and encased in insulating material, (2) long molecules aligned perpendicular to the direction of the conductors that conduct current along the molecules but not between the molecules, (3) graphite aligned to preferentially conducts current in the direction transverse to the conductors, and (4) anisotropic superconducting material aligned to preferentially conducts current in the direction transverse to the conductors.

14. The structure of claim 1 further comprising direct electrical contacts from one or more of the conductors to each of said highly conductive regions within said current barrier layer.

15. The structure of claim 1 wherein said current barrier layer comprises a first current barrier layer having sequential regions of relative high and low conductivity and the structure further comprises a second current barrier layer of sequential regions of alternating relative high and low conductivity for conducting capacitively generated current and for blocking inductively induced current, said high conductivity regions of the first current barrier layer aligned with the low conductivity regions of the second current barrier layer and the low conductivity regions of the first current barrier layer aligned with the high conductivity regions of the second current barrier layer.

16. In a semiconductor device, a structure for conducting current and reducing parasitic effects of currents generated in the semiconductor substrate comprising:
   a substrate of semiconductor material;
   two or more elongated conductors over the substrate, each conductor parallel to the other(s) for at least a portion of their respective lengths and capable of capacitively and inductively inducing current in the substrate;

in one layer spaced from the conductors, means for intercepting and conducting capacitively generated current, located proximate to the elongated conductors and comprising a plurality of coplanar adjacent sequentially alternating regions of high conductivity and resistivity, boundaries between adjacent said regions oriented transverse with respect to the elongated conductors.

17. The structure of claim 16 wherein the means for intercepting and conducting capacitively generated current comprises semiconductor material and the regions of alternating conductivity comprise alternate regions of high and low doping in the semiconductor material.

18. The structure of claim 16 wherein the means for intercepting and conducting capacitively generated current comprises polysilicon and the regions of alternating conductivity comprise alternate regions of high and low doping in the polysilicon.

19. The structure of claim 16 wherein the means for intercepting and conducting capacitively generated current comprises spaced apart strips of highly doped polysilicon.

20. The structure of claim 16 wherein the means for intercepting and conducting capacitively generated current comprises spaced apart strips of silicide.

21. The structure of claim 16 wherein the regions of alternating conductivity comprise spaced apart strips of metal and gaps between said strips of metal.

22. The structure of claim 16 wherein the regions of alternating conductivity comprise alternate regions of highly doped silicon and isolation trenches.

23. The structure of claim 16 wherein the regions of alternating conductivity comprise alternate regions of highly doped n-type and p-type silicon layers.

24. The structure of claim 16 wherein the means for intercepting capacitively generated current comprises spaced apart strips of highly doped semiconductor material.

25. The structure of claim 24 wherein the means for intercepting capacitively generated current comprises spaced apart strips of doped polysilicon.

26. The structure of claim 16 wherein the means for intercepting capacitively generated current comprises a layer of spaced apart strips of metal.

27. The structure of claim 16 wherein the means for intercepting capacitively generated current comprises at least two spaced apart layers, each layer comprising a plurality of sequential regions of alternating conductivity oriented transverse with respect to the elongated conductors for intercepting and conducting capacitively generated current, said first layer disposed over said second layer and the high resistive portions of the first layer aligned with the low resistive portions of the second layer and the low resistive portions of the first layer aligned with the high resistive portions of the second layer.

28. The structure of claim 16 wherein the means for intercepting capacitively generated current comprises at least one intercepting layer disposed above the conductors and at least one intercepting layer disposed below the conductors.

29. The structure of claim 16 wherein the means for intercepting the capacitively generated current comprises a layer of anisotropically conductive material that conducts current transverse to the direction of the conductors and is highly resistive to current parallel to the conductors.

30. The structure of claim 29 wherein the anisotropically conductive material is selected from the group consisting of:
(1) conductive fibers aligned in the direction perpendicular to the conductors and encased in insulating material, (2) long molecules aligned transverse to the direction of the conductors that conduct current along the molecules but not between the molecules, (3) graphite aligned to preferentially conduct current in the direction transverse to the conductors, and (4) anisotropic superconducting material aligned to preferentially conducts current in the direction transverse to the conductors.

31. The structure of claim 16 further comprising direct electrical contacts from one or more of the conductors to the most highly conductive of the sequential regions.

32. In a semiconductor device, a structure for conducting current and reducing parasitic effects of currents generated in the semiconductor substrate comprising:

a substrate of semiconductor material;

in the substrate a single current barrier layer comprising a plurality of coplanar adjacent sequentially alternating regions of high conductivity and resistivity defined within said first current barrier layer;

an insulating material on the semiconductor material; and two or more elongated conductors on the insulating material and over the substrate, each conductor parallel to the other(s) for at least a portion of their respective lengths and all oriented transverse to the sequential regions of alternating conductivity so that inductively induced current in the substrate is interrupted by the regions of relatively low conductivity.

33. The structure of claim 32 wherein the regions of alternating conductivity comprise trenches filled with resistive or insulating material.

34. The structure of claim 32 further comprising a dielectric layer between the plurality of parallel strips and the substrate.

35. The structure of claim 32 wherein the plurality of sequential regions comprises a layer of anisotropically conductive material that conducts current in the direction transverse to the conductors and is highly resistive to current in the direction of the conductors.

36. The structure of claim 32 wherein the anisotropically conductive material is selected from the group consisting of: (1) conductive fibers aligned in the direction transverse to the conductors and encased in insulating material, (2) long molecules aligned transverse to the direction of the conductors that preferentially conduct current along the molecules but not between the molecules, (3) graphite aligned to preferentially conduct current in the direction transverse to the conductors, and (4) anisotropic superconducting material aligned to preferentially conduct current in the direction transverse to the conductors.

37. The structure of claim 32 further comprising direct electrical contacts from one or more of the conductors to the most highly conductive regions of the regions of alternating conductivity.

38. The structure of claim 32 wherein the first plurality of sequential regions of alternating conductivity comprises regions of relative high and low conductivity and the structure further comprises a second plurality of sequential regions of alternating relative high and low conductivity for conducting capacitively generated current and for blocking inductively induced current, said high conductivity regions of the first plurality aligned with the low conductivity regions of the second plurality and the low conductivity regions of the first plurality aligned with the high conductivity regions of the second plurality.

39. In a semiconductor device, a structure for conducting current and reducing parasitic effects of currents generated in the semiconductor substrate comprising:

a substrate of semiconductor material;

in the substrate and at the surface thereof a first current barrier layer comprising a first plurality of strips of parallel, coplanar and spaced apart conductive material with relatively non-conductive regions in the spaces between the parallel coplanar conductive strips; and a dielectric layer covering the plurality of parallel strips of conductive material;

two or more elongated conductors on the dielectric layer, each conductor parallel to the other(s) for at least a portion of their respective lengths and all oriented transverse to the boundaries between the strips of conductive material so that inductively induced current in the conductive material is interrupted by the strip patterning of the conductive material.

40. The structure of claim 39 further comprising direct electrical contacts from one or more of the conductors to the conductive strips.

41. The structure of claim 39 wherein the strips comprise a layer of polysilicon doped in a plurality of sequential adjacent regions of alternating conductivity.

42. The structure of claim 39 wherein the strips comprise highly conductive material selected from the group consisting of: (1) metal, (2) polysilicon, and (3) silicide.

43. The structure of claim 39 wherein the plurality of strips of conductive material comprises a layer of anisotropically conductive material that conducts current transverse to the direction of the conductors and is highly resistive to current parallel to the conductors.

44. The structure of claim 43 wherein the anisotropically conductive material is selected from the group consisting of: (1) conductive fibers aligned in the direction transverse to the conductors and encased in insulating material, (2) long molecules aligned transverse to the direction of the conductors that preferentially conduct current along the molecules but not between the molecules, (3) graphite aligned to preferentially conduct current in the direction transverse to the conductors, and (4) superconducting material aligned to preferentially conduct current in the direction transverse to the conductors.

45. The structure of claim 39 further comprising a second plurality of parallel strips of conductive material over the first plurality of parallel strips and between the first plurality of strips and the elongated conductors, said two pluralities of conductive strips aligned with each other in a staggered formation so that each parallel strip conducts capacitively generated current and blocks inductively induced current.

46. A structure for isolating a first conductor from induced capacitive current of one or more other conductors comprising:

a semiconductor substrate with a an insulating layer over the substrate:

one or more conductors on the insulating layer for carrying current arranged in parallel alignment with each other and spaced from one another;

a single current barrier layer having one or more sets of coplanar capacitive intercepting conductors defined within said current barrier layer, said current barrier layer disposed in the substrate and extending between said first current carrying conductor and one or more said current carrying conductors, said sets of capacitive intercepting conductors only allow current conduction in a direction parallel to the direction of current conduction in said first conductor.

47. The structure of claim 46 wherein the conductors are supported in or on a substrate selected from the group consisting of semiconductor material, silicon, silicon-on-insulator, silicon-on-sapphire, dielectrically isolated material, and printed circuit board.

48. The structure of claim 47 wherein the insulating material is selected from the group consisting of silicon dioxide, silicon nitride and plastic.

* * * * *